(12) United States Patent
Kanai

(10) Patent No.: US 9,818,687 B2
(45) Date of Patent: Nov. 14, 2017

(54) SEMICONDUCTOR MODULE AND METHOD OF MANUFACTURING SEMICONDUCTOR MODULE

(71) Applicant: Fuji Electric Co., Ltd., Kanagawa (JP)

(72) Inventor: Naoyuki Kanai, Nagano (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 0 days.

(21) Appl. No.: 15/177,658

(22) Filed: Jun. 9, 2016

(65) Prior Publication Data

US 2017/0025344 A1    Jan. 26, 2017

(30) Foreign Application Priority Data

Jul. 23, 2015 (JP) .................. 2015-146103

(51) Int. Cl.
*H01L 23/498* (2006.01)
*H01L 23/31* (2006.01)
(Continued)

(52) U.S. Cl.
CPC .... *H01L 23/49894* (2013.01); *H01L 21/4871* (2013.01); *H01L 21/563* (2013.01); *H01L 23/24* (2013.01); *H01L 23/3121* (2013.01); *H01L 23/3142* (2013.01); *H01L 23/3735* (2013.01); *H01L 23/49811* (2013.01); *H01L 23/60* (2013.01); *H01L 23/142* (2013.01); *H01L 24/29* (2013.01); *H01L 24/32* (2013.01); *H01L 24/40* (2013.01); *H01L 24/45* (2013.01); *H01L 24/73* (2013.01); *H01L 25/072* (2013.01); *H01L 2224/291* (2013.01); *H01L 2224/32225* (2013.01); *H01L 2224/40137* (2013.01); *H01L 2224/40227* (2013.01); *H01L 2224/45015* (2013.01); *H01L 2224/4516* (2013.01); *H01L 2224/45124* (2013.01);
(Continued)

(58) Field of Classification Search
CPC ............. H01L 23/3121; H01L 23/3142; H01L 23/49894; H01L 21/4871; H01L 21/563; H01L 23/49811

See application file for complete search history.

(56) References Cited

U.S. PATENT DOCUMENTS

2007/0246833 A1* 10/2007 Soga ........................ H01L 23/24
257/772
2010/0052190 A1* 3/2010 Furukawa ............... H01L 23/24
257/787

(Continued)

FOREIGN PATENT DOCUMENTS

JP            3703978 B2       10/2005

*Primary Examiner* — Nathan W Ha
(74) *Attorney, Agent, or Firm* — Chen Yoshimura LLP

(57) ABSTRACT

A semiconductor module includes an insulated circuit board that includes an insulating substrate, a first conductive plate arranged on a first principal surface of the insulating substrate and within the outer edges of the insulating substrate, and a second conductive plate arranged within the outer edges of the insulating substrate on a second principal surface of the insulating substrate that faces the first principal surface. Furthermore, boundary edges between the first principal surface of the insulating substrate and the side faces of the first conductive plate are covered by an ion gel that contains an ionic liquid.

5 Claims, 6 Drawing Sheets

(51) Int. Cl.
  *H01L 21/56*   (2006.01)
  *H01L 21/48*   (2006.01)
  *H01L 23/24*   (2006.01)
  *H01L 23/60*   (2006.01)
  *H01L 23/373*  (2006.01)
  *H01L 23/00*   (2006.01)
  *H01L 25/07*   (2006.01)
  *H01L 23/14*   (2006.01)

(52) U.S. Cl.
  CPC ............ *H01L 2224/45147* (2013.01); *H01L 2224/45565* (2013.01); *H01L 2224/45624* (2013.01); *H01L 2224/48091* (2013.01); *H01L 2224/48137* (2013.01); *H01L 2224/48227* (2013.01); *H01L 2224/48464* (2013.01); *H01L 2224/73263* (2013.01); *H01L 2224/73265* (2013.01); *H01L 2924/1033* (2013.01); *H01L 2924/10253* (2013.01); *H01L 2924/10272* (2013.01); *H01L 2924/12032* (2013.01); *H01L 2924/13055* (2013.01); *H01L 2924/13091* (2013.01); *H01L 2924/181* (2013.01); *H01L 2924/3511* (2013.01)

(56) References Cited

U.S. PATENT DOCUMENTS

| 2011/0049531 | A1* | 3/2011 | Oka | H01L 21/565 257/77 |
| 2012/0080800 | A1* | 4/2012 | Shinohara | H01L 23/24 257/773 |
| 2013/0175706 | A1* | 7/2013 | Choi | H01L 25/074 257/777 |
| 2013/0270688 | A1* | 10/2013 | Ota | H01L 23/36 257/690 |
| 2013/0328204 | A1* | 12/2013 | Zommer | B23K 1/20 257/765 |
| 2014/0008781 | A1* | 1/2014 | Nishi | H01L 23/52 257/691 |
| 2014/0054751 | A1* | 2/2014 | Shikano | H01L 23/3677 257/621 |
| 2014/0237815 | A1* | 8/2014 | Lau | H01L 21/68 29/834 |
| 2016/0300770 | A1* | 10/2016 | Taya | H01L 23/053 |

* cited by examiner

SEMICONDUCTOR MODULE AND METHOD OF MANUFACTURING SEMICONDUCTOR MODULE

BACKGROUND OF THE INVENTION

Technical Field

The present invention relates to a semiconductor module that includes a power semiconductor device and to a method of manufacturing the semiconductor module.

Background Art

Semiconductor modules that include a power semiconductor device exhibit excellent power conversion efficiency and are widely used in renewable energy fields such as solar power generation and wind power generation, automobiles such as hybrid automobiles and electric automobiles, railway applications such as electric trains, and more. In these types of semiconductor modules, a variety of protective measures are employed not only in the semiconductor device but also in the insulating substrate in order to prevent dielectric breakdown even if high voltages are applied.

Patent Document 1, for example, discloses such a semiconductor device in which a protective treatment is applied to the insulating substrate. This semiconductor device includes a power plate on which a semiconductor element is mounted; an insulating substrate on which the power plate is mounted; a filler that covers the surfaces of the semiconductor element, the power plate, and the insulating substrate; and a creeping breakdown prevention member that is arranged only between the edge regions of the power plate and the insulating substrate, that has a higher breakdown voltage than the filler, and that exhibits stronger adhesion with the insulating substrate than the filler.

In Patent Document 1, this creeping breakdown prevention member has a higher relative permittivity than the filler (which is a silicone gel, for example) and alleviates concentration of electric fields at the edges of the power plate. Specific examples of this surface damage prevention member include epoxy resins, epoxy resins in which aluminum oxide powder is mixed, epoxy resins in which aluminum nitride powder is mixed, epoxy resins in which mica powder is mixed, polyester resins, silicone gels in which aluminum oxide powder is mixed, silicone gels in which aluminum nitride powder is mixed, and silicone gels in which mica powder is mixed.

RELATED ART DOCUMENT

Patent Document

Patent Document 1: Japanese Patent No. 3703978

SUMMARY OF THE INVENTION

However, the relative permittivity of the creeping breakdown voltage prevention member disclosed in Patent Document 1 is only 8.8 (aluminum nitride) at best. In light of the demand for semiconductor modules with increasingly high breakdown voltages in recent years, this type of material cannot be used to sufficiently reduce of the magnitude of the electric fields present. Moreover, reducing the thickness of the insulating substrate, for example, only makes the insulating substrate more prone to creeping breakdown when exposed to stronger electric fields. Therefore, the thickness of the insulating substrate cannot be reduced, and meanwhile, using thick insulating substrates results in increased production costs.

The present invention aims to provide a semiconductor module that alleviates concentration of local electric fields at intersections between the principal surface of an insulating substrate and the side faces of a conductive plate arranged on the principal surface of the insulating substrate and that has an improved dielectric breakdown voltage, as well as a method of manufacturing such a semiconductor module. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides aa semiconductor module, including: an insulated circuit board that includes an insulating substrate, a first conductive plate arranged on a first principal surface of the insulating substrate and within outer edges of the insulating substrate, and a second conductive plate arranged on a second principal surface of the insulating substrate and within the outer edges of the insulating substrate, the second principal surface opposing the first principal surface; an ion gel containing an ionic liquid and formed covering boundary edges of side faces of the first conductive plate where the side faces meet the first principal surface of the insulating substrate; a semiconductor device bonded on the first conductive plate; and a sealing material that covers the insulated circuit board, the ion gel, and the semiconductor device.

In one aspect of the present invention, when a voltage is applied, the ionic liquid contained in the ion gel moves within the ion gel according to the resulting electric potential gradient and gets distributed near the surface of the first conductive plate and/or near the surface of the insulating substrate at the intersections (boundary edges) between the first principal surface of the insulating substrate and the side faces of the first conductive plate, thereby terminating local lines of electric force. This alleviates electric field concentration at the intersections and improves the dielectric breakdown voltage. Moreover, this improvement in the dielectric breakdown voltage of the insulating substrate makes it possible to reduce the thickness of the insulating substrate, thereby making it possible to reduce production costs.

In the semiconductor module according to one aspect of the present invention, it is preferable that the ion gel be a polymer resin gel material that contains an ambient temperature molten salt ionic liquid containing a combination of organic cations and organic anions or a combination of organic cations and inorganic anions. This makes it possible for the cations and anions in the ionic liquid to move within the polymer resin ion gel according to the electric potential gradient even at normal temperatures.

In the semiconductor module according to one aspect of the present invention, it is preferable that an amount of the ionic liquid mixed into the ion gel be set such that a resulting capacitance of the ion gel per unit area is greater than or equal to 1 $\mu F/cm^2$ and less than or equal to 20 $\mu F/cm^2$. This makes it possible to terminate lines of electric force near the surface of the first conductive plate or near the surface of the insulating substrate.

In another aspect, the present disclosure provides a method of manufacturing a semiconductor module including an insulated circuit board that includes an insulating substrate, a first conductive plate arranged on a first principal surface of the insulating substrate and within outer edges of the insulating substrate, and a second conductive plate arranged on a second principal surface of the insulating substrate and within the outer edges of the insulating substrate, the second principal surface opposing the first principal surface, the method including: applying a precursor material of an ion gel containing an ionic liquid to boundary edges of side faces of the first conductive plate where the side faces meet the first principal surface of the insulating substrate; curing the precursor material of the ion gel, thereby forming the ion gel; bonding a semiconductor device on the first conductive plate; and covering the insulated circuit board, the ion gel, and the semiconductor device with a sealing material.

In one aspect of the present invention, the intersections (boundary edges) between the first principal surface of the insulating substrate and the side faces of the first conductive plate are covered by the ion gel that contains the ionic liquid, thereby making it possible to alleviate electric field concentration near the insulating substrate and improve the dielectric breakdown voltage of the insulating substrate.

In the method of manufacturing the semiconductor module according to one aspect of the present invention, it is preferable that in the step of applying the precursor material of the ion gel, the precursor material of the ion gel containing the ionic liquid is applied using an inkjet method or a dispensing method. This makes it possible to reliably apply the ion gel covering the stair-shaped portion where the first principal surface of the insulating substrate and the side faces of the first conductive plate intersect, thereby making it possible to prevent formation of pinholes due to irregular application of the ion gel.

In one aspect of the present invention, when a voltage is applied, the ionic liquid contained in the ion gel moves within the ion gel according to the resulting electric potential gradient and gets distributed near the surface of the first conductive plate and/or near the surface of the insulating substrate at the intersections between the first principal surface of the insulating substrate and the side faces of the first conductive plate, thereby terminating local lines of electric force. This alleviates electric field concentration at the intersections and improves the dielectric breakdown voltage. Moreover, this improvement in the dielectric breakdown voltage of the insulating substrate makes it possible to reduce the thickness of the insulating substrate, thereby making it possible to reduce production costs.

It is to be understood that both the foregoing general description and the following detailed description are exemplary and explanatory, and are intended to provide further explanation of the invention as claimed.

DETAILED DESCRIPTION OF EMBODIMENTS

Next, a semiconductor module and a method of manufacturing a semiconductor module according to one aspect of the present invention will be described with reference to figures.

Figure 1:
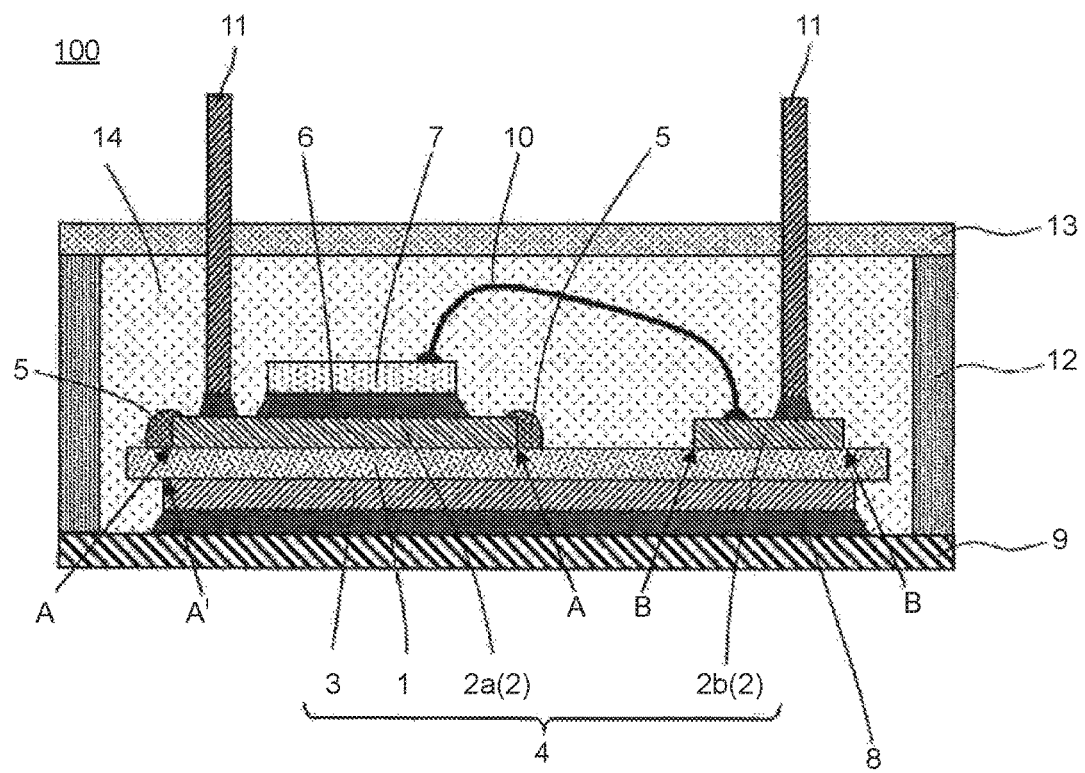
FIG. 1 is a cross-sectional view illustrating a semiconductor module according to an embodiment of the present invention.

FIG. 1 is a cross-sectional view illustrating a semiconductor module according to an embodiment of the present invention. This semiconductor module 100 includes an insulated circuit board 4 that includes an insulating substrate 1, a first conductive plate 2 arranged on a first principal surface (top surface) of the insulating substrate 1 and within the outer edges of the insulating substrate 1, and a second conductive plate 3 arranged within the outer edges of the insulating substrate on a second principal surface (the bottom surface) of the insulating substrate that faces the first principal surface. Furthermore, intersections A (which correspond to the edges of a conductor; boundary edges) between the first principal surface of the insulating substrate 1 and the side faces of the first conductive plate 2 are covered by an ion gel 5 that contains an ionic liquid. Moreover, a semiconductor device 7 is bonded to the first conductive plate 2 using solder 6, and a base plate 9 that functions as a heat transfer surface is bonded to the second conductive plate 3 using solder 8. In addition, the semiconductor module 100 includes wires 10 that electrically connect the semiconductor device 7 to the first conductive plate 2 (or to another semiconductor device 7 (not illustrated in the figure)) and external connection terminals 11. The configuration described above is housed in a case 12. The case 12 is filled with a sealing material 14 and then sealed airtight using a lid 13.

In the semiconductor module 100, the first conductive plate 2 is divided into a plurality of island-shaped regions, and the semiconductor device 7 and the external connection terminals 11 are bonded to these regions to form an electrical circuit. Moreover, the second conductive plate 3 is thermally bonded to a cooler (not illustrated in the figure) via the solder 8 and the base plate 9.

In the semiconductor module 100, the second conductive plate 3 is grounded to ground potential or is set to a floating potential that is substantially equal to ground potential such that during operation of the circuit, a voltage is applied to prescribed island-shaped regions of the first conductive plate 2.

For example, assume that the semiconductor device 7 is an N-channel insulated-gate bipolar transistor (IGBT). Also, assume that a first conductive plate 2a is connected to a collector electrode arranged on the rear surface of the semiconductor device 7 via the solder 6 and that a first conductive plate 2b is connected to an emitter electrode arranged on the front surface of the semiconductor device 7 via the wires 10. In order to activate the IGBT, the emitter electrode is grounded and a voltage is applied to the collector electrode. In other words, the first conductive plate 2b is grounded and a voltage is applied to the first conductive plate 2a. Therefore, while the electric field created at intersections B between the first principal surface of the insulating substrate 1 and the side faces of the first conductive plate 2b that is connected to the emitter electrode is substantially equal to 0 in magnitude, the electric field created at the intersections A between the first principal surface of the insulating substrate 1 and the side faces of the first conductive plate 2a can be very strong in some cases. For example, if a surge voltage is applied or a counter-electromotive force is generated due to the inductance of the collector, the applied voltage can become extremely high, which can in some cases cause dielectric breakdown starting at the intersections A.

Here, the intersections A will be referred to as "conductor edges", and the creation of strong electric fields at these conductor edges will be referred to as "electric field concentration". The surface of a conductor is an equipotential surface, and lines of electric force must be orthogonal to all points on an equipotential surface. As a result, at the edges of the conductor, the lines of electric force bend and increase in density in order to remain orthogonal, which always creates a strong electric field at the conductor edges simply due to the geometry thereof.

In one aspect of the present invention, the ion gel 5 is arranged along the intersections A (the points that become more prone to dielectric breakdown due to electric field concentration) between the first principal surface of the insulating substrate 1 and the side faces of the prescribed island-shaped regions of the first conductive plate 2a to which a high voltage is applied, thereby alleviating electric field concentration at the points within the insulating substrate 1 that are in contact with the intersections A. This makes it possible to improve the dielectric breakdown voltage of the insulating substrate 1.

However, if unexpected surge voltages can occur even when the module is normally operated at a low voltage, the ion gel 5 may also be arranged along the intersections B between the first principal surface of the insulating substrate 1 and the side faces of the island-shaped regions of the first conductive plate 2b.

To achieve further reinforcement, the ion gel 5 may also be arranged along intersections A' between the second principal surface of the insulating substrate 1 and the side faces of the second conductive plate 3.

Next, each component of the semiconductor module 100 will be described in more detail.

The material used for the insulating substrate 1 is not particularly limited. However, it is preferable that an insulating material with low dielectric loss and good electrical insulation properties be used. Examples of such an insulating material include $Al_2O_3$ (relative permittivity=9.8 at 1 MHz), AlN (relative permittivity=8.7 at 1 MHz), and SiN (relative permittivity=8.1 at 1 MHz), for example. Of these, AlN and SiN have high thermal conductivity and can efficiently dissipate the Joule heat generated by the semiconductor device 7 and are therefore particularly well-suited to use in high-output semiconductor modules. The minimum thickness of the insulating substrate 1 is determined by the required dielectric breakdown voltage and mechanical strength. In one aspect of the present invention, the ion gel 5 alleviates local electric field concentration in the insulating substrate 1 and thereby makes it possible to improve the dielectric breakdown voltage (as will be described in more detail later). In this way, the insulating substrate 1 can withstand high voltage operation even when the thickness thereof is less than or equal to 1 mm (such as 0.625 mm), for example. Setting the thickness of the insulating substrate 1 to a value less than 1 mm makes it possible to reduce material costs.

The materials used for the first conductive plate 2 and the second conductive plate 3 are not particularly limited. However, it is preferable that metal materials with excellent electrical conductivity and thermal conductivity such as Cu, a Cu alloy, Al, or an Al alloy be used. (Note that a surface treatment such as Ni plating may also be applied in order to prevent rust or the like.) The film thicknesses of the first conductive plate 2 and the second conductive plate 3 are not particularly limited. However, electrical resistance increases as thickness decreases, and bonding with the insulating substrate 1 becomes more difficult as thickness increases. Therefore, it is preferable that the film thicknesses be set to a value in the range of 0.1 mm to 1 mm. The method used to bond the first conductive plate 2 and the second conductive plate 3 to the insulating substrate 1 is not particularly limited. Examples of suitable methods include direct copper bonding and active metal brazing, for example. The insulated circuit board 4 in which the first conductive plate 2 and the second conductive plate 3 are bonded to the insulating substrate 1 is known as a DCB substrate or an AMB substrate according to which bonding method is used. Moreover, in the insulated circuit board 4, the first conductive plate 2 and the second conductive plate 3 are arranged within the outer edges of the insulating substrate 1 in order to increase the creepage distance from the first conductive plate 2 around the outer edges of the insulating substrate 1 to the second conductive plate 3, thereby making the insulating substrate less prone to creeping breakdown due to creeping discharge.

The ion gel 5 is a gel material that contains an ionic liquid and is arranged covering the intersections A between the first principal surface of the insulating substrate 1 and the side faces of the first conductive plate 2.

The ionic liquid is an ambient temperature molten salt made solely from ions and remains a liquid across a wide range of temperatures. This ionic liquid contains a combination of organic cations and organic anions or a combination of organic cations and inorganic anions.

The ionic liquid used in one aspect of the present invention is made from cations such as imidazolium cations, pyridinium cations, or piperidinium cations and anions such as phosphonate anions, borate anions, or sulfonate anions because this type of ionic liquid exhibits a large capacitance per unit area.

Examples of imidazoliums include 1-ethyl-3-methylimidazolium bis(trifluoromethanesulfonyl)imide (EMIM TFSI), 1-ethyl-3-methylimidazolium bis(fluorosulfonyl)imide (EMIM FSI), 1-ethyl-3-methylimidazolium bis(pentafluorosulfonyl)imide (EMIM BETI), 1-ethyl-3-methylimidazolium dicyanamide (EMIM DCA), 1-ethyl-3-methylimidazolium tetrafluoroborate (EMIM BF4), and 1-butyl-3-methylimidazolium bis(trifluoromethylsulfonyl)imide (BMIM TFSI). Examples of pyridiniums include 1-butyl-3-methylpyridinium bis(trifluoromethylsulfonyl)imide (BMP TFSI). Examples of piperidiniums include N-methyl-N-propylpiperidinium bis(trifluoromethanesulfonyl)imide (PP13 TFSI).

Meanwhile, the gel material contained in the ionic liquid is not particularly limited. Examples include silicone polymers, poly(styrene-b-methyl methacrylate-b-styrene) triblock copolymers (PS-PMMA-PS), poly(styrene-b-ethylene oxide-b-styrene) triblock copolymers (PS-PEO-PS), and poly(vinylidene fluoride-co-hexafluoropropylene) copolymers (PVdF-HEP). Moreover, a copolymer in which a crosslinking agent such as N,N,N',N'-tetra(trifluoromethanesufonyl)-hexane-1,6-diamine (C6TFSA), N,N,N',N'-tetra(trifluoromethanesufonyl)-dodecane-1,12-diamine (C12TFSA), or bis(trichlorosilyl)hexane is mixed into a polymer material such as poly(4-vinylpyridine) (P4VP), poly(dimethylaminoethyl methacrylate) (PDMEMA), poly (vinylphenol) (PVP), poly(vinyl cinnamate) (PVCN), or polystyrene (PS) may be used.

When a positive voltage is applied to the ion gel 5, the anions in the ionic liquid contained in the ion gel move within the ion gel according to the resulting electric potential gradient and form an electrical double layer of the ionic liquid that is one anion (several nm) thick on the surface of the first conductive plate 2. Meanwhile, the cations in the ionic liquid contained in the ion gel also move within the ion gel according to the electric potential gradient and form another electrical double layer of the ionic liquid that is one cation (several nm) thick on the surface of the insulating substrate 1. The capacitance of these electrical double layers is significantly larger than the capacitance of the ion gel itself. In practice, the capacitance of the ion gel 5 may be assumed to be determined by the surface density of the ionic liquid contained in the ion gel 5 and to not depend on the film thickness with which the ion gel 5 is applied. If the amount of ionic liquid is adjusted such that the resulting capacitance per unit area of the ion gel 5 is equal to 1 $\mu F/cm^2$ to 20 $\mu F/cm^2$, then according to Gauss's law, the majority of the lines of electric force coming out of the surface of the first conductive plate 2 are terminated by an anion in the facing layer of the ionic liquid that sandwiches the electrical double layer. Similarly, the majority of the lines of electric force going into the insulating substrate 1 are terminated by a cation in the facing layer of the ionic liquid that sandwiches the electrical double layer.

Here, Gauss's law refers to the physical law that states that if a charge exists within a region, the electric flux going into (or coming out of) that region is proportional to the net negative (or positive) electric charge within that region.

To achieve a large capacitance, the ion gel must contain a large amount of ionic liquid. This makes it possible for more of the ionic liquid to gather around the electrical double layers, thereby making it possible to terminate more of the lines of electric force. Gathering a sufficiently large amount of charge relative to the capacitance of 1 $\mu F/cm^2$ to 20 $\mu F/cm^2$ makes it possible for the electrical double layer to efficiently shield the majority of the lines of electric force coming out of the side faces of the first conductive plate 2. This reduces concentration of the lines of electric force near the intersections A, thereby making it possible to alleviate electric field concentration in the insulating substrate 1.

The semiconductor device 7 is not particularly limited. Examples of devices that can be used include devices such as metal-oxide-semiconductor field-effect transistors (MOSFETs), insulated-gate bipolar transistors (IGBTs), and Schottky barrier diodes (SBDs) formed in an Si substrate, an SiC substrate, a GaN substrate, or the like. In the semiconductor module 100, a single device may be used, or the semiconductor module 100 may be implemented as a hybrid module in which a plurality of different types of devices are used in combination. For example, two IGBTs formed in an Si substrate can be used in combination with two SBDs formed in an SiC substrate to form an inverter circuit.

The material used for the base plate 9 is not particularly limited. However, it is preferable that a material that has high thermal conductivity and is not prone to warping even when subjected to high temperature processes such as soldering be used, such as a Cu plate or an Al—SiC plate, for example.

The material used for the wires 10 is not particularly limited. Al wires, Al-plated steel wires, or Cu wires may be used, for example. The diameter of the wires is not particularly limited either. However, in high current applications, it is preferable that wires of 300 µm to 500 µm in diameter be used, for example. Alternatively, instead of the wires 10, a lead frame or a wiring substrate and conductive pins may be used to electrically connect the components and form a circuit.

The materials used for the case 12 and the lid 13 are not particularly limited. A thermoplastic resin such as a PPS resin or a PBS resin may be used, for example.

The material used for the sealing material 14 is not particularly limited. A material such as a silicone gel (relative permittivity=2.8) or an epoxy resin (relative permittivity=3.5) may be used, for example.

Next, the effects of the ion gel 5 in one aspect of the present invention will be described in more detail.

Figure 2:
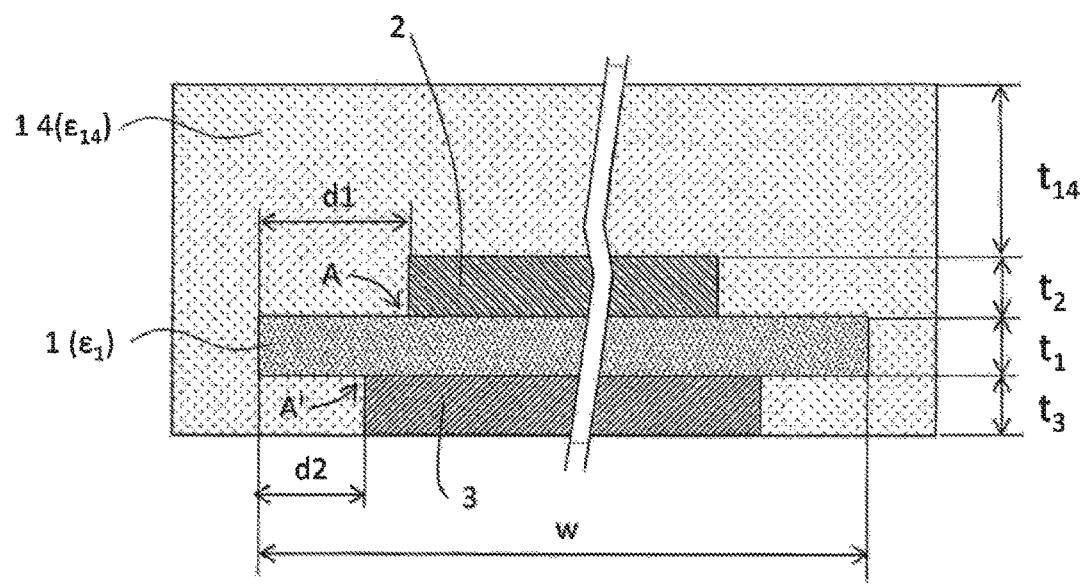
FIG. 2 illustrates a simulation model used in an electromagnetic field simulation.

First, the results of an electromagnetic field simulation performed to analyze the degree of electric field concentration at the intersections A for a case in which the ion gel 5 was not used will be described. FIG. 2 illustrates the simulation model used in this simulation. In this reference model, the relative permittivity $\in_1$ of the insulating substrate 1 was set to 8.1, the thickness $t_1$ of the insulating substrate 1 was set to 1 mm, the distance $d_1$ from the outer edges of the insulating substrate 1 to the intersections A on the first principal surface side was set to 0.7 mm, the distance $d_2$ from the outer edges of the insulating substrate 1 to the intersections A' on the second principal surface side was set to 0.7 mm, the thicknesses $t_2$ and $t_3$ of the first conductive plate 2 and the second conductive plate 3 were both set to 0.3 mm, and the relative permittivity $\in_{14}$ of the sealing material 14 was set to 3.5. Next, the electric field strength at the intersections A in models in which the values of the above parameters were changed was compared to the electric field strength in the reference model (which was normalized to 1).

Figure 3:
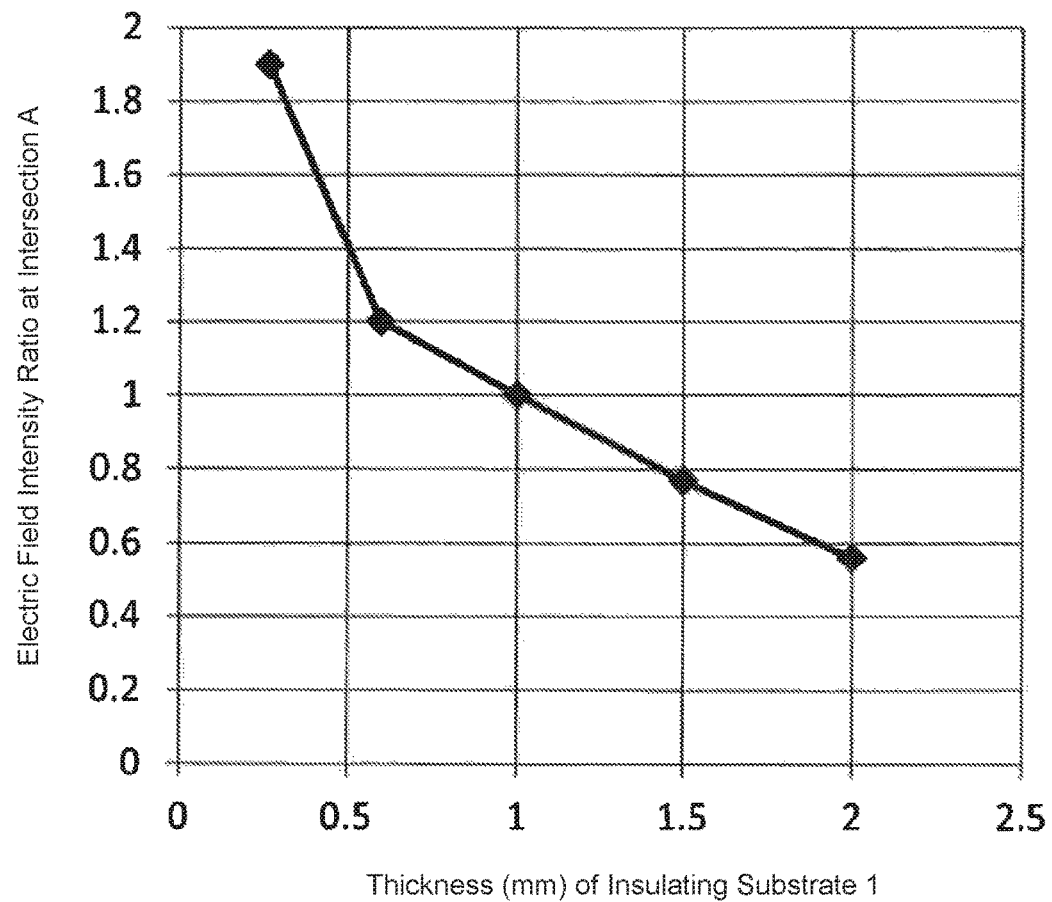
FIG. 3 is a graph showing the relationship between the thickness of an insulating substrate 1 and the resulting electric field strength ratio at intersections A as obtained from an electromagnetic field simulation.

FIG. 3 is a graph showing the relationship between the thickness $t_1$ of the insulating substrate 1 and the resulting electric field strength ratio at the intersections A. As the insulating substrate 1 decreases in thickness, the strength of the electric field increases. Moreover, the strength of the electric field begins to increase rapidly once the thickness of the insulating substrate 1 is less than 0.6 mm.

Figure 4:
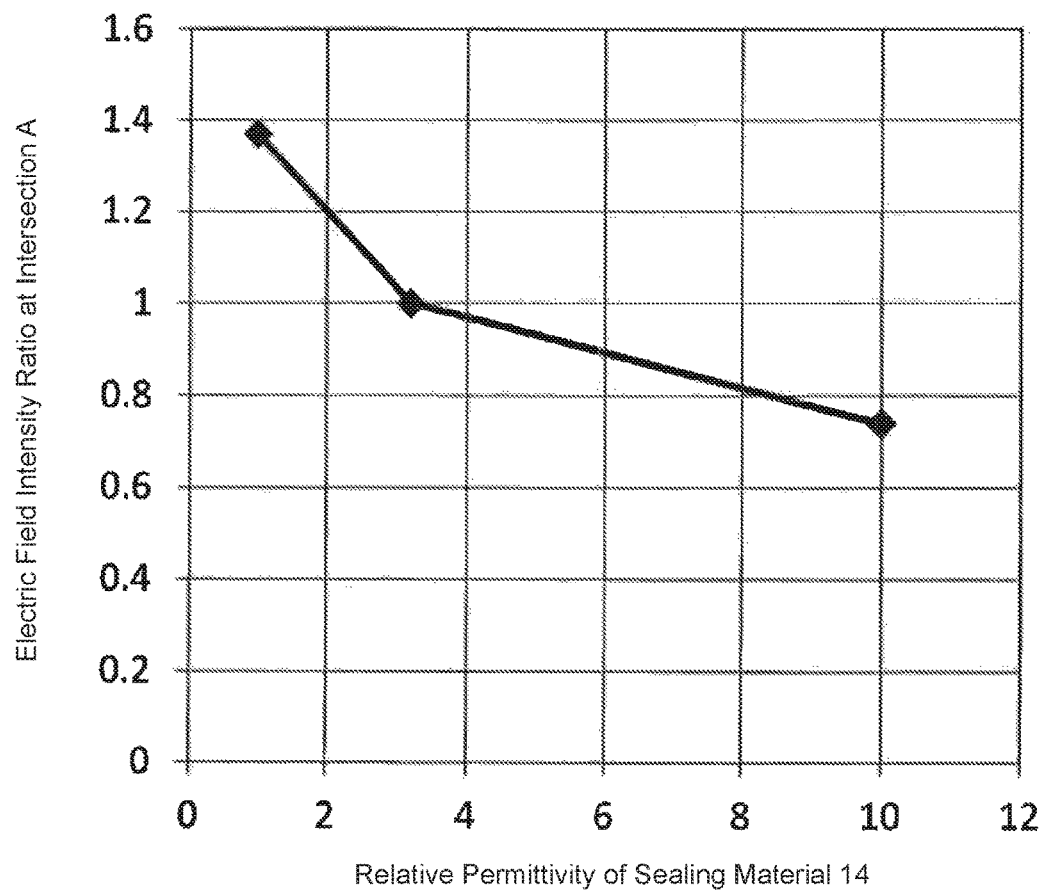
FIG. 4 is a graph showing the relationship between the relative permittivity of a sealing material 14 and the resulting electric field strength ratio at intersections A as obtained from an electromagnetic field simulation.

FIG. 4 is a graph showing the relationship between the relative permittivity $\in_{14}$ of the sealing material 14 and the resulting electric field strength ratio at the intersections A. As the relative permittivity of the sealing material 14 increases, the electric field concentration at the intersections A is reduced. However, increasing the relative permittivity from 2.8 to 10 only decreases the electric field strength ratio from 1 to 0.75.

The reason that increasing the relative permittivity of the sealing material 14 reduces electric field concentration is because as the relative permittivity of the sealing material 14 increases, the number of characteristic lines of electric force through the sealing material 14 decreases in an inversely proportional manner relative to the relative permittivity. As a result, the lines of electric force that gather densely near the intersections A are pushed towards the regions in which there are fewer lines of electric force. This reduces the density of lines of electric force at the intersections A and thereby reduces electric field concentration. Here, the lines of electric force are only being redistributed rather than actually being shielded by an electrical double layer like when using the ion gel, and therefore the resulting reduction in the strength of the electric field is only marginal.

Therefore, even if a creeping breakdown prevention material with a relative permittivity of approximately 8.8 at most as is described in Patent Document 1 (Japanese Patent No. 3703978) is used, the resulting reduction in the electric field strength is relatively small, and it remains difficult to reduce the thickness of the insulating substrate 1 to 0.6 mm.

In one aspect of the present invention, however, the ion gel 5 that contains the ionic liquid is arranged covering the intersections A. If a voltage that causes the first conductive plate 2 to take a higher electric potential than the second conductive plate 3 is applied, for example, the resulting lines of electric force will extend from the first conductive plate 2 towards the second conductive plate 3. The anions in the ionic liquid then move to the interface between the first conductive plate 2 and the ion gel 5, where an electrical double layer is formed due to the electric polarization between the surface charge of the first conductive plate 2 and the anions. Furthermore, the cations in the ionic liquid move to the interface between the ion gel 5 and the insulating substrate 1, where an electrical double layer is formed due to the electric polarization between the cations and the surface charge of the insulating substrate 1. Due to the relationship between the amount of charge and the electric flux density as defined by Gauss's law, if a sufficient amount of ionic liquid is contained in the gel, the majority of the lines of electric force coming out of the first conductive plate 2 will be terminated by the anions that moved to the interface between the first conductive plate 2 and the ion gel 5. Moreover, the majority of the lines of electric force coming out of the insulating substrate 1 will be terminated by the cations that moved to the interface between the ion gel 5 and the insulating substrate 1. The cations and anions are therefore distributed such that the concentration of electric fields at the intersections A is less pronounced, thereby making it possible to significantly reduce the strength of the electric fields near the intersections A.

Meanwhile, if a voltage that causes the first conductive plate 2 to take a lower electric potential than the second conductive plate 3 is applied, the cations in the ionic liquid move to and form an electrical double layer at the interface between the first conductive plate 2 and the ion gel 5, and the anions in the ionic liquid move to and form an electrical double layer at the interface between the ion gel 5 and the insulating substrate 1. Once again, due to the relationship between the amount of charge and the electric flux density as defined by Gauss's law, if a sufficient amount of ionic liquid is contained in the gel, the majority of the lines of electric force coming out of the first conductive plate 2 will be terminated by the cations that moved to the interface between the first conductive plate 2 and the ion gel 5. Similarly, the majority of the lines of electric force coming out of the insulating substrate 1 will be terminated by the anions that moved to the interface between the ion gel 5 and the insulating substrate 1. The cations and anions are therefore distributed such that the concentration of electric fields at the intersections A is less pronounced, thereby making it possible to significantly reduce the strength of the electric fields near the intersections A.

Materials such as the sealing material which are made from an epoxy resin or the like already exhibit a definite ionic polarization or orientation polarization, and therefore the molecules in these materials cannot be moved. In other words, these types of materials cannot move any significant amount of electric charge to the surface of the first conductive plate 2 or the insulating substrate 1 in order to form an electric field shield from the resulting high-density charge distribution.

The reasons that the ion gel makes it possible to achieve such an excellent reduction in the strength of the electric field in comparison with conventional high relative permittivity materials are as follows. First, the cations and anions in the ion gel can be moved freely to change the spatial charge distribution thereof. Moreover, the electrical double layers formed due to the accumulation of cations and anions at the respective interfaces make it possible to easily achieve a high capacitance of 1 $\mu F/cm^2$ to 20 $\mu F/cm^2$ at those interfaces, which cannot be achieved with conventional high relative permittivity materials. Therefore, the ion gel makes it possible to move the charges contained therein to the surfaces of the first conductive plate 2 and the insulating substrate 1 in order to form an electric field shield from the resulting high-density charge distribution of the ionic liquid.

In this way, the ion gel 5 alleviates electric field concentration caused by the geometry of the conductor edges, thereby making it possible to reduce dielectric breakdown of the insulating substrate 1 caused by breakdown currents that originate at the intersections A and flow through the insulating substrate 1. For the same reason, the ion gel 5 also makes it possible to reduce creeping breakdown caused by creeping discharges that propagate along the outer edges of the insulating substrate 1.

Figure 5:
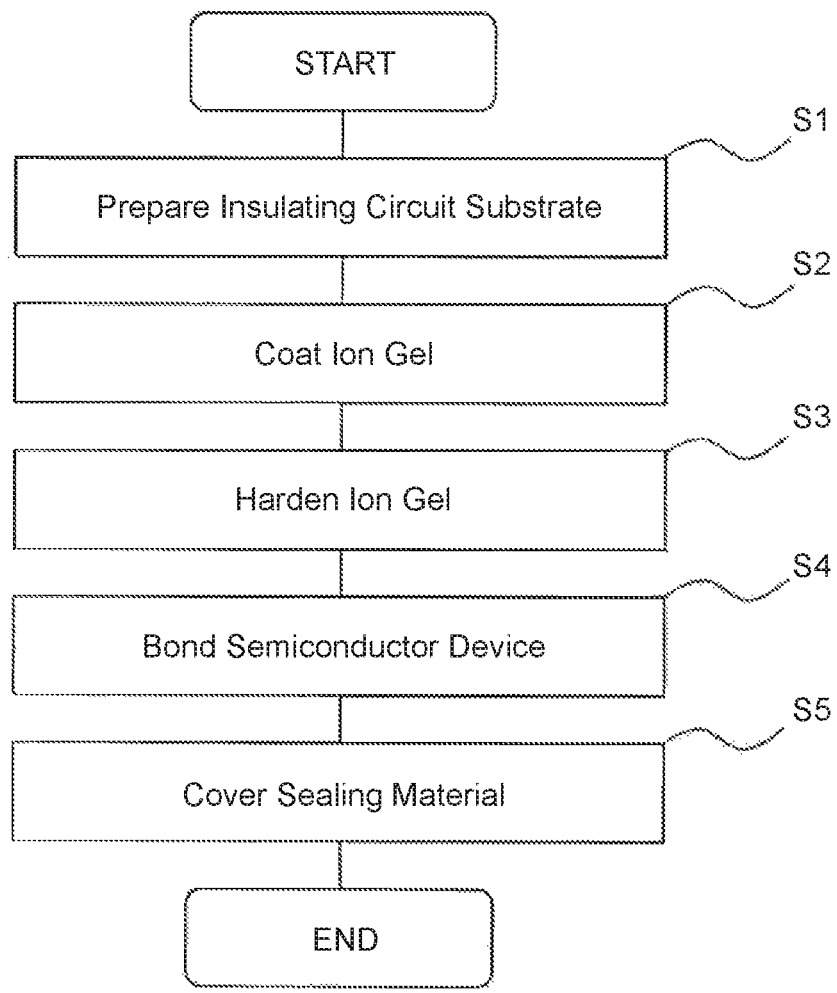
FIG. 5 illustrates an example of a method of manufacturing a semiconductor module according to the present invention.

As illustrated in FIG. 5, a method of manufacturing the semiconductor module 100 according to one aspect of the present invention may include: a step S1 in which the insulated circuit board 4 is prepared; a step S2 in which an ion gel precursor material that contains an ionic liquid is applied to the intersections A between the first principal surface of the insulating substrate 1 and the side faces of the first conductive plate 2; a step S3 in which the ion gel precursor material is cured to form the ion gel 5; a step S4 in which the semiconductor device 7 is bonded to the first conductive plate 2 (this step also includes bonding the base plate 9 to the second conductive plate 3 and bonding the wires 10); and a step S5 in which the insulated circuit board, the ion gel, and the semiconductor device are covered with a sealing material.

The method used to form the ion gel 5 is not particularly limited. However, it is preferable that an ionic liquid, a gel material, and an organic solvent (such as acetone, ethyl acetate, or toluene) be mixed together to prepare an ion gel precursor material, and then that ion gel precursor material be formed as a film on the intersections A between the first principal surface of the insulating substrate 1 and the side faces of the first conductive plate 2 using a method such as a dispensing method or an inkjet method and then heat cured to form the ion gel 5, for example. This makes it possible to reliably apply the ion gel, thereby making it possible to prevent formation of pinholes due to irregular application of the ion gel. It is preferable that the film thickness of the ion gel 5 be 0.1 to 2 mm and more preferable that the film thickness of the ion gel 5 be 0.1 to 1.0 mm, for example. Film thicknesses less than 0.1 mm make it difficult to completely cover the intersections A.

WORKING EXAMPLES

Next, certain aspects of the present invention will be described in more detail using specific working examples.

Note, however, that the present invention is not limited in any way by these working examples.

Working Example 1

Figure 6:
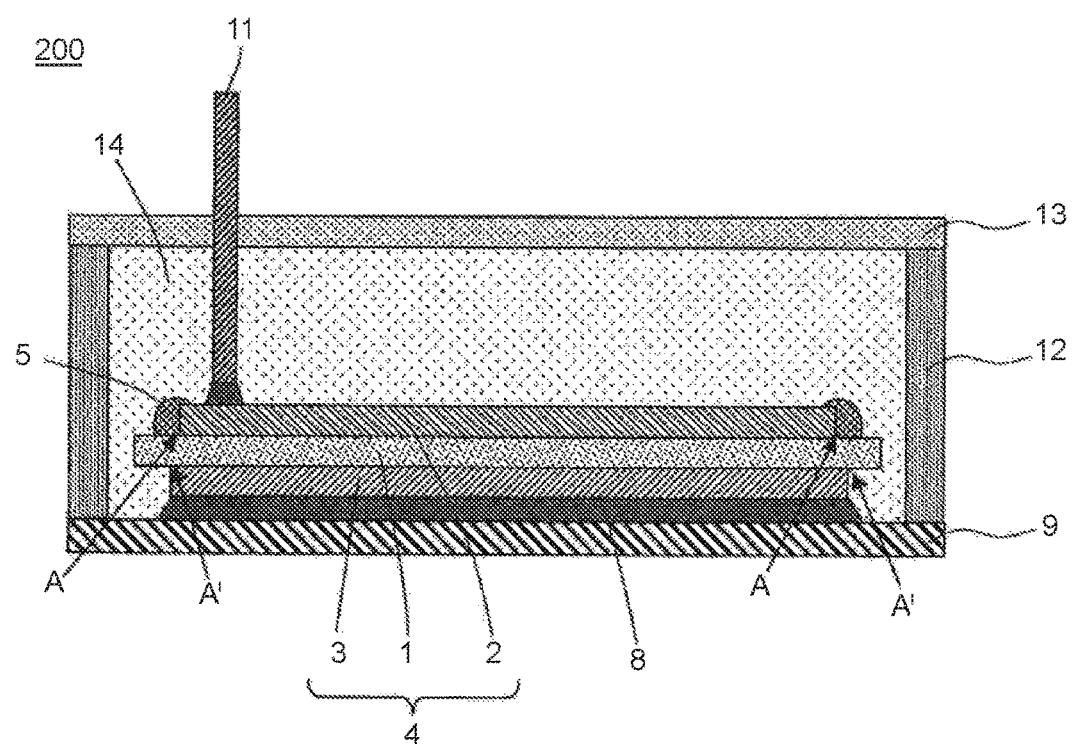
FIG. 6 is a cross-sectional view illustrating a semiconductor module used in a dielectric breakdown voltage evaluation.

FIG. 6 is a cross-sectional view illustrating a dielectric breakdown voltage evaluation sample 200. An insulated circuit board 4 (a Denka AlN plate made by Denka Company Limited) in which an Al first conductive plate 2 and an Al second conductive plate 3 both 0.2 mm in thickness were respectively layered on both surfaces of an AlN insulating substrate 1 that was 1 mm in thickness was used. In the insulated circuit board 4, the minimum distance (a first edge distance) from the outer edge of the insulating substrate 1 to the first conductive plate 2 was 1.5 mm, and the minimum distance (a second edge distance) from the outer edge of the insulating substrate 1 to the second conductive plate 3 was 0.5 mm. Next, an ion gel precursor material was prepared by mixing together 1 part by mass 1-ethyl-3-methylimidazolium bis(trifluoromethanesulfonyl)imide (EMIM TFSI) as the ionic liquid, 5 parts by mass a poly(styrene-b-methyl methacrylate-b-styrene) triblock copolymer (PS-PMMA-PS) as the gel material, and 15 parts by mass ethyl acetate as a solvent. This mixture was then applied to the intersections A between the first principal surface of the insulating substrate 1 and the side faces of the first conductive plate 2 using an inkjet printer and heat cured at 100° C. to form the ion gel 5 along the intersections A. Then, the insulated circuit board 4 was bonded to an Al—SiC base plate 9 (an Alsink made by Denka Company Limited) using Sn-40Pb solder (Nihon Handa Co., Ltd.) and housed inside a case 12 having an external connection terminal 11. The case 12 was then filled with a silicone gel sealing material 14 (TSE3051SK, made by Momentive Performance Materials Japan) and heat cured at 100° C. for 1 hour. Finally, a lid 13 was fixed to the case 12 using an adhesive, thereby completing the dielectric breakdown voltage evaluation sample 200. This sample was only used to evaluate dielectric breakdown voltage, and therefore a semiconductor device was not included in the configuration.

Working Example 2

Working Example 2 was produced the same as Working Example 1 except in that the thickness of the AlN insulating substrate in the insulated circuit board 4 (a Denka AlN plate made by Denka Company Limited) was set to 0.625 mm.

Working Example 3

Working Example 3 was produced the same as Working Example 1 except in that an insulated circuit board 4 (a Denka SN plate made by Denka Company Limited) that included an SiN insulating substrate with a thickness of 0.625 mm was used.

Comparative Example 1

Comparative Example 1 was produced the same as Working Example 1 except in that the thickness of the AlN insulating substrate 1 was set to 0.625 mm and the ion gel 5 was not formed along the intersections A.

<Dielectric Breakdown Voltage Evaluation Method>

An AC voltage with a frequency of 50 Hz and an amplitude of 6 kV was applied for a duration of 1 minute between the first conductive plate 2 arranged on the first principal surface of the insulating substrate 1 and the second conductive plate 3 arranged on the second principal surface of the insulating substrate. Working examples that did not exhibit any dielectric breakdown were treated as passes, and working examples that did exhibit dielectric breakdown were treated as failures.

<Evaluation Results>

Table 1 shows the results of the dielectric breakdown voltage evaluation. Working Example 1 (in which the thickness of the AlN substrate 1 was 1 mm) passed the dielectric breakdown evaluation. In Working Example 2, the thickness of the AlN substrate 1 was reduced to 0.625 mm. However, because the ion gel 5 was arranged along the intersections A between the first principal surface of the insulating substrate 1 and the side faces of the first conductive plate 2, concentration of the electric field was alleviated and the insulating substrate 1 did not exhibit any signs of dielectric breakdown. Therefore, Working Example 2 passed the dielectric breakdown evaluation as well. In Comparative Example 1, however, the ion gel 5 was not arranged along the intersections A. Therefore, electric field concentration was not sufficiently alleviated, and the AlN substrate 1 of thickness 0.625 mm failed the dielectric breakdown evaluation. Furthermore, in Working Example 3, an SiN substrate 1 of thickness 0.625 mm was used. Moreover, because the ion gel 5 was arranged along the intersections A between the first principal surface of the insulating substrate 1 and the side faces of the first conductive plate 2, Working Example 3 passed the dielectric breakdown evaluation as well even though the thickness of the insulating substrate 1 was reduced to a value as low as 0.625 mm. Therefore, arranging the ion gel 5 along the intersections A made it possible to reduce the thickness of the insulating substrates to a value as low as 0.625 mm.

TABLE 1

|  | Working Example 1 | Working Example 2 | Working Example 3 | Comparative Example 1 |
|---|---|---|---|---|
| Material of insulating substrate 1 | AlN | AlN | SiN | AlN |
| Thickness of insulating substrate 1 (mm) | 1 | 0.625 | 0.625 | 0.625 |
| Ion gel 5 used? | Yes | Yes | Yes | No |
| Dielectric breakdown voltage (AC voltage of 6 kV applied for 1 minute) | Passed | Passed | Passed | Failed |

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention

What is claimed is:

1. A semiconductor module, comprising:
   an insulated circuit board that includes an insulating substrate, a first conductive plate arranged on a first principal surface of the insulating substrate and within outer edges of the insulating substrate, and a second conductive plate arranged on a second principal surface of the insulating substrate and within the outer edges of the insulating substrate, the second principal surface opposing the first principal surface;

an ion gel containing an ionic liquid and formed on the first principal surface of the insulating substrate, covering boundary edges of side faces of the first conductive plate where said side faces meet the first principal surface of the insulating substrate, said ion gel being confined within the first principal surface, not covering side faces of the insulating substrate and not reaching to the second principal surface of the insulting substrate;

a semiconductor device bonded on the first conductive plate; and a sealing material that covers the insulated circuit board, the ion gel, and the semiconductor device.

2. The semiconductor module according to claim 1, wherein the ion gel is a polymer resin gel material that contains an ambient temperature molten salt ionic liquid containing a combination of organic cations and organic anions or a combination of organic cations and inorganic anions.

3. The semiconductor module according to claim 2, wherein an amount of the ionic liquid mixed into the ion gel is set such that a resulting capacitance of the ion gel per unit area is greater than or equal to 1 $\mu F/cm^2$ and less than or equal to 20 $\mu F/cm^2$.

4. A method of manufacturing a semiconductor module including an insulated circuit board that includes an insulating substrate, a first conductive plate arranged on a first principal surface of the insulating substrate and within outer edges of the insulating substrate, and a second conductive plate arranged on a second principal surface of the insulating substrate and within the outer edges of the insulating substrate, the second principal surface opposing the first principal surface, the method comprising:

applying a precursor material of an ion gel containing an ionic liquid to boundary edges of side faces of the first conductive plate where said side faces meet the first principal surface of the insulating substrate;

curing the precursor material of the ion gel, thereby forming the ion gel on the first principal surface of the insulating substrate, covering said boundary edges of side faces of the first conductive plate, said ion gel being confined within the first principal surface, not covering side faces of the insulating substrate and not reaching to the second principal surface of the insulting substrate;

bonding a semiconductor device on the first conductive plate; and covering the insulated circuit board, the ion gel, and the semiconductor device with a sealing material.

5. The method of manufacturing the semiconductor module according to claim 4, wherein in the step of applying the precursor material of the ion gel, the precursor material of the ion gel containing the ionic liquid is applied using an inkjet method or a dispensing method.

* * * * *